(12) United States Patent
Yang et al.

(10) Patent No.: US 8,901,744 B2
(45) Date of Patent: Dec. 2, 2014

(54) HYBRID COPPER INTERCONNECT STRUCTURE AND METHOD OF FABRICATING SAME

(71) Applicant: International Business Machines Corporation, Armonk, NY (US)

(72) Inventors: Chih-Chao Yang, Glenmont, NY (US); David V. Horak, Essex Junction, VT (US); Charles W. Koburger, III, Delmar, NY (US); Shom Ponoth, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/960,410

(22) Filed: Aug. 6, 2013

(65) Prior Publication Data

US 2013/0320545 A1    Dec. 5, 2013

Related U.S. Application Data

(62) Division of application No. 13/191,999, filed on Jul. 27, 2011, now Pat. No. 8,525,339.

(51) Int. Cl.
| | |
|---|---|
| *H01L 23/52* | (2006.01) |
| *H01L 23/48* | (2006.01) |
| *H01L 21/768* | (2006.01) |
| *H01L 21/44* | (2006.01) |
| *H01L 21/4763* | (2006.01) |
| *H01L 23/532* | (2006.01) |

(52) U.S. Cl.
CPC .... *H01L 23/53238* (2013.01); *H01L 21/76841* (2013.01); *H01L 21/76877* (2013.01); *H01L 21/76847* (2013.01); *H01L 21/76843* (2013.01); *H01L 21/76882* (2013.01)
USPC ............... 257/774; 257/E21.585; 438/675; 438/672; 438/674; 438/618

(58) Field of Classification Search
CPC .............. H01L 23/53238; H01L 21/76841; H01L 21/76877; H01L 21/76843; H01L 21/76847
USPC .......... 257/774, E21.585; 438/675, 672, 674, 438/618
See application file for complete search history.

(56) References Cited

U.S. PATENT DOCUMENTS

| | | | |
|---|---|---|---|
| 5,814,557 A | * | 9/1998 | Venkatraman et al. ........ 438/622 |
| 6,100,196 A | | 8/2000 | Chan et al. |
| 6,107,687 A | | 8/2000 | Fukada et al. |
| 6,130,156 A | * | 10/2000 | Havemann et al. .......... 438/637 |
| 6,136,707 A | | 10/2000 | Cohen |

(Continued)

*Primary Examiner* — Luan C Thai
(74) *Attorney, Agent, or Firm* — Scully, Scott, Murphy & Presser, P.C.; Catherine Ivers, Esq.

(57) ABSTRACT

A hybrid interconnect structure containing copper regions that have different impurities levels within a same opening is provided. In one embodiment, the interconnect structure includes a patterned dielectric material having at least one opening located therein. A dual material liner is located at least on sidewalls of the patterned dielectric material within the at least one opening. The structure further includes a first copper region having a first impurity level located within a bottom region of the at least one opening and a second copper region having a second impurity level located within a top region of the at least one opening and atop the first copper region. In accordance with the present disclosure, the first impurity level of the first copper region is different from the second impurity level of the second copper region.

20 Claims, 5 Drawing Sheets

(56) References Cited

U.S. PATENT DOCUMENTS

| | | | |
|---|---|---|---|
| 6,239,494 | B1 | 5/2001 | Besser et al. |
| 6,274,935 | B2 | 8/2001 | Uzoh |
| 6,380,083 | B1 | 4/2002 | Gross |
| 6,444,580 | B1 | 9/2002 | Lopatin et al. |
| 6,469,387 | B1 | 10/2002 | Lopatin et al. |
| 6,509,262 | B1 | 1/2003 | Lopatin |
| 6,525,425 | B1 * | 2/2003 | Woo et al. .................. 257/758 |
| 6,607,981 | B1 | 8/2003 | Takahashi et al. |
| 6,621,165 | B1 | 9/2003 | Lopatin et al. |
| 6,624,074 | B1 | 9/2003 | Lopatin et al. |
| 6,624,075 | B1 * | 9/2003 | Lopatin et al. ............... 438/687 |
| 6,646,353 | B1 | 11/2003 | Lopatin |
| 6,656,828 | B1 | 12/2003 | Maitani et al. |
| 6,717,236 | B1 | 4/2004 | Lopatin et al. |
| 6,762,500 | B2 | 7/2004 | Ahn et al. |
| 6,787,446 | B2 | 9/2004 | Enomoto et al. |
| 6,835,660 | B2 | 12/2004 | Usami |
| 6,844,203 | B2 | 1/2005 | Ahn et al. |
| 6,849,927 | B2 | 2/2005 | Farrar |
| 6,852,167 | B2 | 2/2005 | Ahn |
| 6,864,169 | B2 | 3/2005 | Noguchi et al. |
| 6,900,539 | B2 | 5/2005 | Motoyama |
| 6,903,016 | B2 | 6/2005 | Cohen |
| 6,924,226 | B2 | 8/2005 | Cohen |
| 6,930,045 | B2 | 8/2005 | Ikeda |
| 6,933,230 | B2 | 8/2005 | Dubin |
| 6,933,609 | B2 | 8/2005 | Narukawa |
| 6,936,925 | B1 * | 8/2005 | Lopatin et al. ............... 257/762 |
| 6,952,052 | B1 | 10/2005 | Marathe et al. |
| 6,964,874 | B2 | 11/2005 | Werner et al. |
| 6,974,767 | B1 | 12/2005 | Lopatin |
| 6,984,891 | B2 | 1/2006 | Ahn et al. |
| 6,995,470 | B2 | 2/2006 | Ahn et al. |
| 7,067,421 | B2 | 6/2006 | Ahn et al. |
| 7,091,611 | B2 | 8/2006 | Ahn et al. |
| 7,105,434 | B2 | 9/2006 | Cohen |
| 7,105,914 | B2 | 9/2006 | Farrar |
| 7,121,919 | B2 | 10/2006 | Farrar |
| 7,144,805 | B2 | 12/2006 | Chen et al. |
| 7,160,577 | B2 | 1/2007 | Ahn et al. |
| 7,169,700 | B2 * | 1/2007 | Chang et al. ................. 438/637 |
| 7,193,327 | B2 | 3/2007 | Yu et al. |
| 7,199,052 | B2 | 4/2007 | Cohen |
| 7,205,620 | B2 | 4/2007 | Ahn et al. |
| 7,208,804 | B2 | 4/2007 | Ahn et al. |
| 7,211,512 | B1 | 5/2007 | Ahn et al. |
| 7,220,665 | B2 | 5/2007 | Farrar |
| 7,229,924 | B2 | 6/2007 | Farrar |
| 7,232,757 | B2 | 6/2007 | Noguchi et al. |
| 7,244,677 | B2 | 7/2007 | Ritzdorf et al. |
| 7,253,108 | B2 | 8/2007 | Zonca |
| 7,253,501 | B2 | 8/2007 | Lee et al. |
| 7,253,521 | B2 | 8/2007 | Ahn et al. |
| 7,262,130 | B1 | 8/2007 | Ahn et al. |
| 7,262,505 | B2 | 8/2007 | Ahn et al. |
| 7,273,810 | B2 | 9/2007 | Naruse et al. |
| 7,279,411 | B2 | 10/2007 | Agarwala et al. |
| 7,300,882 | B2 | 11/2007 | Sakata |
| 7,301,190 | B2 | 11/2007 | Farrar |
| 7,368,378 | B2 | 5/2008 | Ahn et al. |
| 7,378,737 | B2 | 5/2008 | Farrar |
| 7,391,115 | B2 | 6/2008 | Usami et al. |
| 7,394,157 | B2 | 7/2008 | Farrar |
| 7,402,516 | B2 | 7/2008 | Ahn et al. |
| 7,410,668 | B2 | 8/2008 | Ahn |
| 7,422,979 | B2 | 9/2008 | Michaelson et al. |
| 7,432,151 | B2 | 10/2008 | Kim |
| 7,451,411 | B2 | 11/2008 | Hau-Riege et al. |
| 7,462,269 | B2 | 12/2008 | Ritzdorf et al. |
| 7,504,674 | B2 | 3/2009 | Farrar |
| 7,535,103 | B2 | 5/2009 | Farrar |
| 7,544,574 | B2 | 6/2009 | Chiang et al. |
| 7,560,793 | B2 | 7/2009 | Derderian et al. |
| 7,576,006 | B1 | 8/2009 | Yu et al. |
| 7,585,768 | B2 * | 9/2009 | Bu et al. .................... 438/678 |
| 7,589,029 | B2 | 9/2009 | Derderian et al. |
| 7,648,899 | B1 | 1/2010 | Banerji et al. |
| 7,655,564 | B2 | 2/2010 | Shinriki et al. |
| 7,666,773 | B2 | 2/2010 | Huotari et al. |
| 7,670,646 | B2 | 3/2010 | Ahn et al. |
| 7,682,496 | B2 | 3/2010 | Cohen |
| 7,732,922 | B2 | 6/2010 | Yang et al. |
| 7,745,934 | B2 | 6/2010 | Farrar |
| 7,799,671 | B1 | 9/2010 | Banerji et al. |
| 7,799,674 | B2 | 9/2010 | Shinriki et al. |
| 8,138,084 | B2 * | 3/2012 | Akolkar .................... 438/653 |
| 2009/0169760 | A1 | 7/2009 | Akolkar et al. |

* cited by examiner

HYBRID COPPER INTERCONNECT STRUCTURE AND METHOD OF FABRICATING SAME

CROSS REFERENCE TO RELATED APPLICATION

This application is a divisional of U.S. patent application Ser. No. 13/191,999, filed Jul. 27, 2011 the entire content and disclosure of which is incorporated herein by reference.

BACKGROUND

The present disclosure relates to a semiconductor structure and a method of fabricating the same. More particularly, the present disclosure relates to a hybrid copper interconnect structure containing interconnect features that contain different levels of copper purity therein as well as a method of fabricating the same.

Generally, semiconductor devices include a plurality of circuits which form an integrated circuit (IC) fabricated on a semiconductor substrate. A complex network of signal paths will normally be routed to connect the circuit elements distributed on the surface of the substrate. Efficient routing of these signals across the device requires formation of multi-level or multilayered schemes, such as, for example, single or dual damascene wiring structures. The wiring structure typically includes copper, Cu, since Cu based interconnects provide higher speed signal transmission between large numbers of transistors on a complex semiconductor chip as compared with aluminum, Al, based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's IC product chips by embedding the metal lines and metal vias (e.g., conductive features) in a dielectric material having a dielectric constant of less than 4.0.

Resistance/capacitance reduction in current Cu back-end-of-the-line (BEOL) interconnect structures is getting more and more challenging. As such, any method of reducing the resistance/capacitance within a Cu BEOL structure is needed. Also, needed are interconnect structures in which the reliable thereof is maintained or even enhanced as compared with conventional Cu BEOL interconnect structures.

SUMMARY

The present disclosure provides hybrid interconnect structures containing copper regions, i.e., copper features, that have different impurities levels within a same opening. For example, the present disclosure can provide an interconnect structure containing copper regions that have different impurities levels between a via opening and a line opening. In the present disclosure, the copper regions containing different impurities levels can be achieved utilizing a combination of physical vapor deposition of a copper region having a low impurity level (i.e., less than 20 ppm) and copper reflow, with electroplating another copper region having a high impurity level (i.e., 100 ppm or greater). The combination of physical vapor deposition and copper reflow, with electroplating eliminates the need for completely filling an opening with electroplated copper, reduces overburden within the interconnect structure, lowers copper resistivity, and completely fills re-entrant profiles.

In one embodiment, the present disclosure provides an interconnect structure that includes a patterned dielectric material having at least one opening located therein. The disclosed structure also includes a dual material liner located at least on sidewalls of the patterned dielectric material within the at least one opening. The structure further includes a first copper region containing a first impurity level located within a bottom region of the at least one opening and a second copper region containing a second impurity level located within a top region of the at least one opening and atop the first copper region. In accordance with the present disclosure, the first impurity level of the first copper region is different from the second impurity level of the second copper region.

In another embodiment, a method of fabricating an interconnect structure including copper regions containing different impurity levels located within a patterned dielectric material is provided. The method of the present disclosure includes forming a patterned dielectric material having at least one opening located therein. A dual material liner is formed at least on sidewalls of the patterned dielectric material within the at least one opening. Next, a first copper region containing a first impurity level is provided within a bottom region of the at least one opening and then a second copper region containing a second impurity level is provided within a top region of said at least one opening and atop the first copper region. In accordance with the present disclosure, the first impurity level of the first copper region is different from the second impurity level of the second copper region.

DETAILED DESCRIPTION

Figure 1:
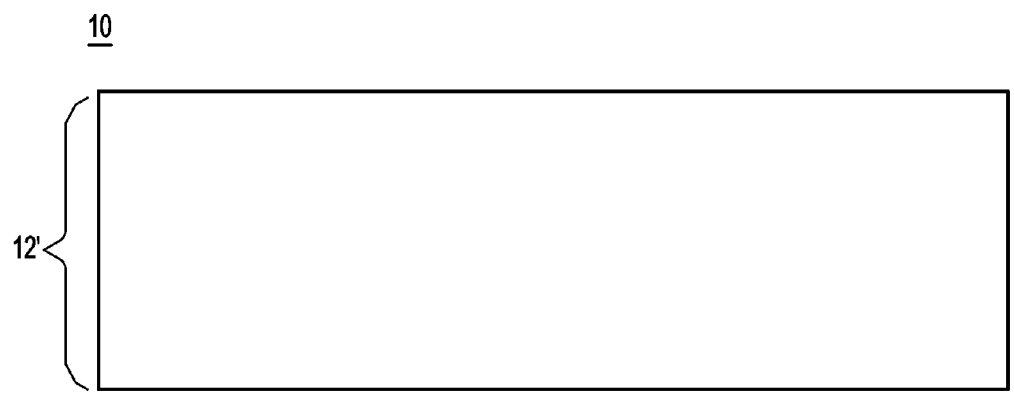
FIG. 1 is a pictorial representation (through a cross sectional view) illustrating an initial structure including a dielectric material that can be employed in one embodiment of the present disclosure.

The present disclosure, which provides a hybrid copper interconnect structure containing interconnect features that contain different levels of copper purity therein as well as a method of fabricating the same, will now be described in greater detail by referring to the following discussion and drawings that accompany the present application. It is noted that the drawings of the present application are provided for illustrative purposes only and, as such, the drawings are not drawn to scale. Also, like elements within the drawings of the present disclosure are referred to by like reference numerals.

In the following description, numerous specific details are set forth, such as particular structures, components, materials, dimensions, processing steps and techniques, in order to provide a thorough understanding of the present invention. However, it will be appreciated by one of ordinary skill in the art that the present disclosure may be practiced without these specific details. In other instances, well-known structures or processing steps have not been described in detail in order to avoid obscuring the various embodiments of the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Reference is first made to FIGS. 1-7 which are pictorial representations (through cross sectional views) illustrating one exemplary hybrid copper interconnect structure of the present disclosure through various processing steps. In this embodiment, a copper region 22 containing a high impurity level is first formed in each of the at least one openings 14 located with a patterned dielectric material 12'. A copper layer 24 containing a low impurity level is formed within each of the at least one openings 14 and then reflow into copper region 24'. As such, this embodiment forms a hybrid interconnect structure in which the copper region 24' of low impurity level is formed in an upper portion of each of the at least one openings 14, and the copper region 22 of high impurity level is formed in a lower region of each of the at least one openings 14.

Specifically, FIG. 1 illustrates an initial structure 10 that can be employed in the present disclosure. The initial structure 10 includes a blanket layer of dielectric material (herein after referred to as dielectric material 12). The initial structure 10 is typically located upon a substrate (not shown in the drawings of the present application). The substrate may comprise a semiconducting material, an insulating material, a conductive material or any combination including multilayers thereof. When the substrate is comprised of a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present disclosure also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, an alloy of at least two elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon.

When the substrate comprises a combination of an insulating material and a conductive material, the substrate may represent a lower interconnect level of a multilayered interconnect structure.

The dielectric material 12 of the initial structure 10 includes any interlevel or intralevel dielectric including inorganic dielectrics or organic dielectrics. The dielectric material 12 may be porous, non-porous or contain regions and/or surfaces that are porous and other regions and/or surfaces that may be non-porous. Some examples of suitable dielectrics that can be used as the dielectric material 12 include, but are not limited to, silicon dioxide, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The dielectric material 12 typically has a dielectric constant of 4.0 or less, with a dielectric constant of 3.8 or less being more typical. All dielectric constants mentioned herein are relative to a vacuum, unless otherwise noted. Dielectrics that have a dielectric constant of 4.0 or less typically have a lower parasitic cross talk as compared with dielectric materials that have a dielectric constant of greater than 4.0. The thickness of the dielectric material 12 may vary depending upon the dielectric material used as well as the exact number of dielectric layers within the dielectric material 12. Typically, and for normal interconnect structures, the dielectric material 12 has a thickness from 50 nm to 1000 nm. Other thickness can also be used for dielectric material 12.

The dielectric material 12 can be formed utilizing a conventional deposition process including, but not limited to, chemical vapor deposition (CVD), plasma enhanced chemical vapor deposition (PECVD), evaporation, chemical solution deposition and spin-on coating.

Figure 2:
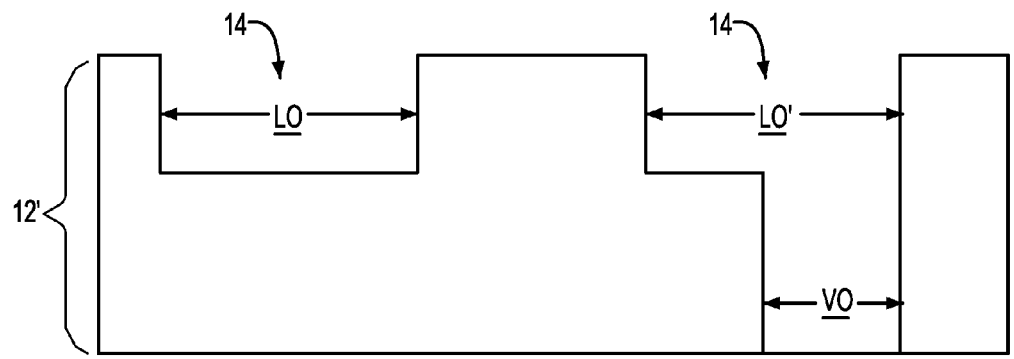
FIG. 2 is a pictorial representation (through a cross sectional view) illustrating the initial structure of FIG. 1 after patterning the same.

Referring now to FIG. 2, there is illustrated the initial structure 10 of FIG. 1 after forming at least one opening 14 within the dielectric material 12. In FIG. 2, the dielectric material including the at least one opening 14 can be referred to as patterned dielectric material which is labeled as element 12'.

The at least one opening 14 that is formed into the dielectric material 12 can be formed utilizing lithography and etching. The lithographic process includes forming a photoresist (not shown) atop the dielectric material 12, exposing the photoresist to a desired pattern of radiation and developing the exposed photoresist utilizing a conventional resist developer. In some embodiments, a hard mask (also not shown) such as, for example, a layer of silicon oxide and/or silicon nitride, can be interposed between the photoresist and the dielectric material 12. The etching process can include a dry etching process (such as, for example, reactive ion etching, ion beam etching, plasma etching or laser ablation), and/or a wet chemical etching process. Typically, reactive ion etching is used in providing the at least one opening 14 into the first dielectric material 12. In some embodiments, the etching process can include a first pattern transfer step in which the pattern provided to the photoresist is transferred to the hard mask, the patterned photoresist is then removed by an ashing step, and thereafter, a second pattern transfer step is used to transfer the pattern from the patterned hard mask into the underlying dielectric material 12. When present, the hard mask can be removed after the patterning process or it can remain on the structure until after a subsequent planarization process is employed.

The depth of the at least one opening 14 that is formed into the dielectric material 12 (measured from the upper surface of the dielectric material 12 to the bottom wall of the at least one opening 14) may vary. In some embodiments, the at least one opening 14 may extend entirely through the dielectric material 12. In yet other embodiments, the at least one opening 14 stops within the dielectric material 12 itself. In yet further embodiments, different depth openings can be formed into the dielectric material 12.

The at least one opening 14 that is formed into the dielectric material 12 may be a via opening, a line opening, and/or a combined via/line opening. In one embodiment, and when a combined via/line opening is formed, a via opening can be formed first and then a line opening is formed atop and in communication with the via opening. In another embodiment, and when a combined via/line opening is formed, a line opening can be formed first and then a via opening is formed atop and in communication with the line opening. In FIG. 2, and by way of an example, two openings 14 are shown. The opening 14 on the left hand side of the drawing that does not extend entirely through the dielectric material represents a line opening (labeled as LO in FIG. 2), while the other opening 14 on the right hand side of the drawing represents a combined via and line opening (labeled as VO and LO' in FIG. 2).

When a via or line is formed, a single damascene process (including the above mentioned lithography and etching steps) can be employed. When a combined via/line is formed a dual damascene process (including at least one iteration of the above mentioned lithography and etching steps) can be employed.

Figure 3:
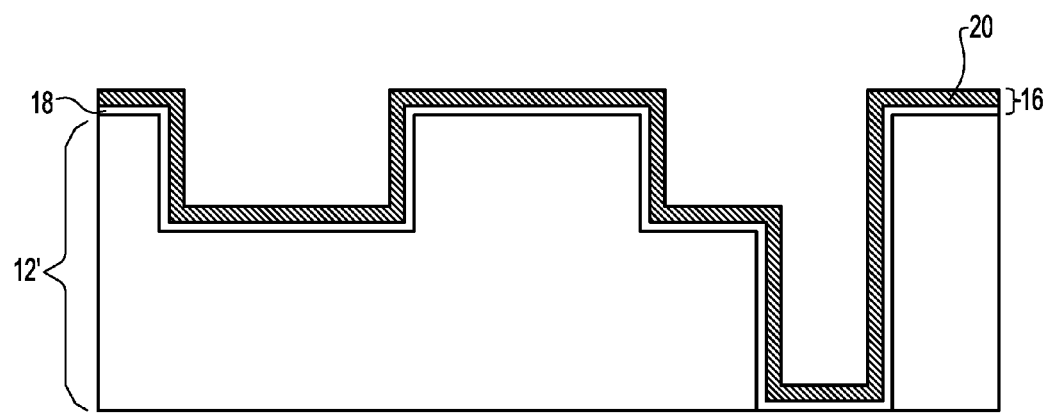
FIG. 3 is a pictorial representation (through a cross sectional view) illustrating the structure of FIG. 2 after formation of a dual material liner including a bottom diffusion barrier layer and a top wetting layer within the openings that are located within the dielectric material.

Referring now to FIG. 3, there is illustrated the structure of FIG. 2 after formation of a dual material liner 16 within the at least one opening 14 and atop the patterned dielectric material 12'. As shown, the dual material liner 16 covers sidewalls of the patterned dielectric material 12' within each opening 14 as well as a bottom wall of each opening 14. The dual material liner 16 includes a diffusion barrier layer 18 that is in contact with wall portions of the patterned dielectric material 12', and a wetting layer 20 that is in contact with an upper surface of the diffusion barrier layer 18.

The diffusion barrier layer 18 of the dual material liner 16 serves as a barrier to prevent a conductive material from diffusing there through. In the present disclosure, the diffusion barrier layer 18 of the dual material liner 16 is a metal nitride such as, for example, TaN, TiN, RuN, RuTaN and WN. The thickness of the diffusion barrier layer 18 of the dual material liner 16 may vary depending on the deposition process used in forming the same as well as the material employed. Typically, the diffusion barrier layer 18 of the dual material liner 16 has a thickness from 2 nm to 50 nm, with a thickness from 5 nm to 20 nm being more typical. The diffusion barrier layer 18 of the dual material liner 16 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition and plating.

As mentioned above, the dual material liner 16 also includes a wetting layer 20 that is located atop the diffusion barrier layer 18. The term "wetting layer" is used throughout the present disclosure to denote an elemental metal that serves as a substrate to enhance the subsequent reflow of an overlying copper layer. In one embodiment, the wetting layer 20 of the dual material liner 16 includes elemental Ru. In another embodiment, the wetting layer 20 of the dual material liner 16 includes elemental Co. In yet a further embodiment, the wetting layer 20 of the dual material liner 16 includes elemental Ta. In a further embodiment, the wetting layer 20 of the dual material liner 16 includes elemental W.

The thickness of the wetting layer 20 of the dual material liner 16 may vary depending on the deposition process used in forming the same as well as the material employed. Typically, the wetting layer 20 of the dual material liner 16 has a thickness from 1 nm to 20 nm, with a thickness from 2 nm to 5 nm being more typical. The wetting layer 20 of the dual material liner 16 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition and plating.

In some embodiments, an optional plating seed layer (not specifically shown) can be formed atop the dual material liner 16. The optional plating seed layer is employed to selectively promote subsequent electroplating of copper. The optional plating seed layer may comprise Cu, a Cu alloy, Ir, an Jr alloy, Ru, a Ru alloy (e.g., TaRu alloy) or any other suitable noble metal or noble metal alloy having a low metal-plating overpotential. Typically, Cu or a Cu alloy plating seed layer is employed, when a Cu metal is to be subsequently electroplated within the at least one opening 14. The thickness of the optional seed layer may vary depending on the material of the optional plating seed layer as well as the technique used in forming the same. Typically, the optional plating seed layer has a thickness from 2 to 80 nm. The optional plating seed layer can be formed by a conventional deposition process including, for example, CVD, PECVD, ALD, and PVD.

Figure 4:
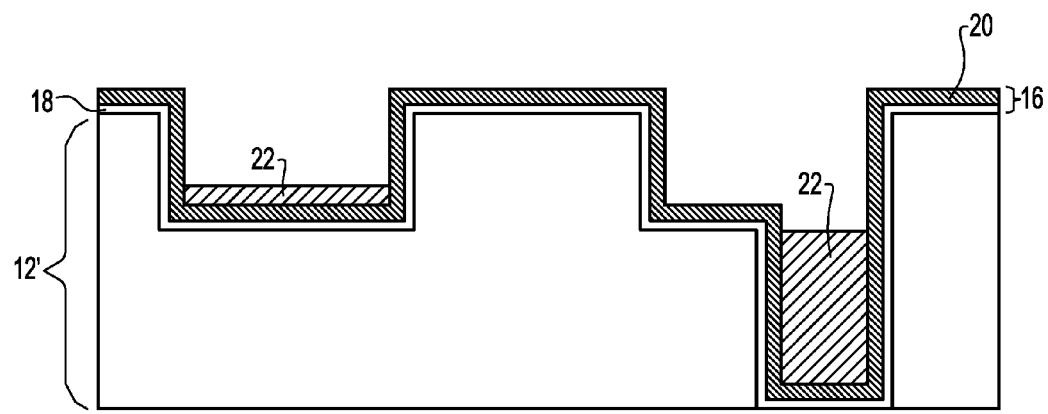
FIG. 4 is a pictorial representation (through a cross sectional view) illustrating the structure of FIG. 3 after partially filling each of the openings with a copper region containing a high impurity level.

Referring now to FIG. 4, there illustrated the structure of FIG. 3 after partially filling each of the at least one openings 14 with a copper region 22 containing a high impurity level. By "high" it is meant that copper region 22 has an impurity level of 100 ppm or greater, with an impurity level of greater than 150 ppm being more typical. In some embodiments, copper region 22 can include carbon, chloride, oxygen and/or sulfur as impurities. Other impurities including, but not limited to, S—O fragments can also be present in copper region 22.

In embodiments in which the impurities include carbon, the carbon impurity can be typically present in the copper region 22 in an amount from 100 ppm to 400 ppm, with an amount from 150 ppm to 250 ppm being more typical.

In embodiments in which the impurities include chloride, the chloride impurity can be typically present in the copper region 22 in an amount from 100 ppm to 400 ppm, with an amount from 150 ppm to 250 ppm being more typical.

In embodiments in which the impurities include oxygen, the oxygen impurity can be typically present in the copper region 22 in an amount from 100 ppm to 400 ppm, with an amount from 150 ppm to 250 ppm being more typical.

In embodiments in which the impurities include sulfur, the sulfur impurity can be typically present in the copper region 22 in an amount from 100 ppm to 400 ppm, with an amount from 150 ppm to 250 ppm being more typical.

The copper region 22 containing the high impurity level can be formed partially within each of the at least one openings 14 utilizing an electroplating, i.e., electrodeposition, process. Typically, the electroplating process used in forming the copper region 22 containing the high impurity level includes a bottom-up plating process. In one embodiment of the present disclosure, the partial filling of each of the at least one openings 14 can be achieved utilizing a timed electroplating process. Alternatively, the partial filling of each of the openings 14 can be achieved by overfilling each of the at least one openings 14 with electroplated copper, and then recessing the electroplated copper to a specific and predetermined depth within each of the at least one openings 14 utilizing a selective etching process such as, but not limited to, a mixed solution of HF, $H_2SO_4$ and HCl.

Electroplating is a process in which metal ions in a solution are moved by an electric field to coat an electrode. The process uses electrical current to reduce cations of a desired material from a solution and coat a conductive object with a thin layer of the material, such as a metal. In electroplating, the part to be plated is the cathode of the circuit. In the current disclosure, the dual material liner 16 or the optional seed layer is employed as the cathode of the circuit. The anode that is employed in the electroplating process may or may not be made of the same metal as to be plated. During the plating process of the present disclosure, an electroplating bath which includes one or more sources of copper ions is used. The one or more sources of copper ions that can be present in the electroplating bath include copper salts such as, but not limited to, copper halides, copper sulfates, copper phosphates, copper acetates, and copper citrate.

Figure 5:
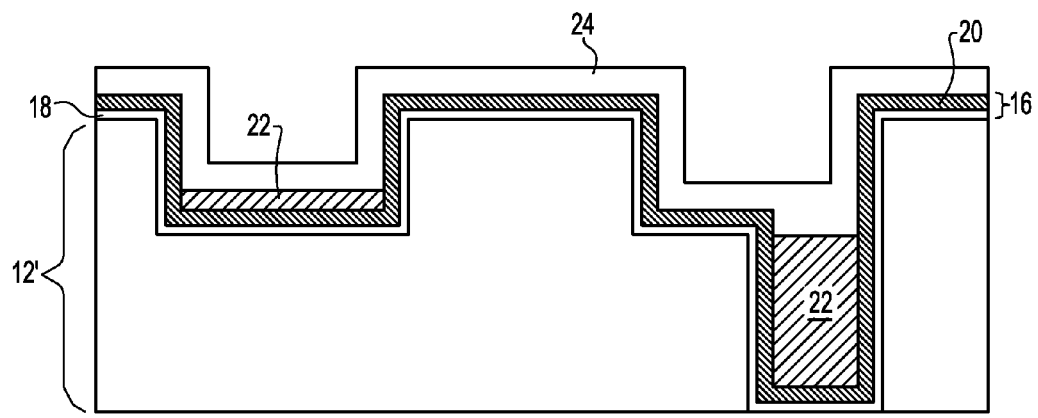
FIG. 5 is a pictorial representation (through a cross sectional view) illustrating the structure of FIG. 4 after forming a copper layer containing a low impurity level within each of the openings and atop the patterned dielectric material.

Referring now to FIG. 5, there is illustrated the structure of FIG. 4 after forming a copper layer 24 containing a low impurity level within each of the at least one openings 14 and atop the patterned dielectric material 12'. Within each of the openings 14, a portion of copper layer 24 is formed on exposed surfaces of the wetting layer 20, while another portion of copper layer 24 is formed atop an exposed surface of copper region 22 containing the high impurity level.

By "low" it is meant that copper layer 24 typically has an impurity level of less than 20 ppm, with an impurity level of less than 5 ppm being more typical. In some embodiments, copper layer 24 can include the same or different impurities as mentioned above for copper region 22. Typically, copper layer 24 includes carbon and/or oxygen as impurities.

The copper layer 24 containing the low impurity level can be formed utilizing a physical vapor deposition (PVD) process. Physical vapor deposition is used herein to describe any of a variety of methods to deposit a copper film by the condensation of a vaporized form of copper onto a structure. Physical vapor deposition involves purely physical processes such as high vacuum evaporation or plasma sputter bombardment rather than involving a chemical reaction at the surface to be coated as in chemical vapor deposition. In a physical vapor deposition process such as is used in the present disclosure, the layer that is deposited is not conformal, i.e., the copper layer 24 has portions that are located on horizontal surfaces of the structure that are thicker than other portions of the copper layer that are formed on vertical surfaces of the structure.

In one embodiment, the physical vapor deposition process employed in forming the copper layer 24 containing the low impurity level includes a deposition temperature of 25° C. or greater. In another embodiment, the physical vapor deposition process employed in forming the copper layer 24 containing the low impurity level includes a deposition temperature from 0° C. to 80° C.

Figure 6:
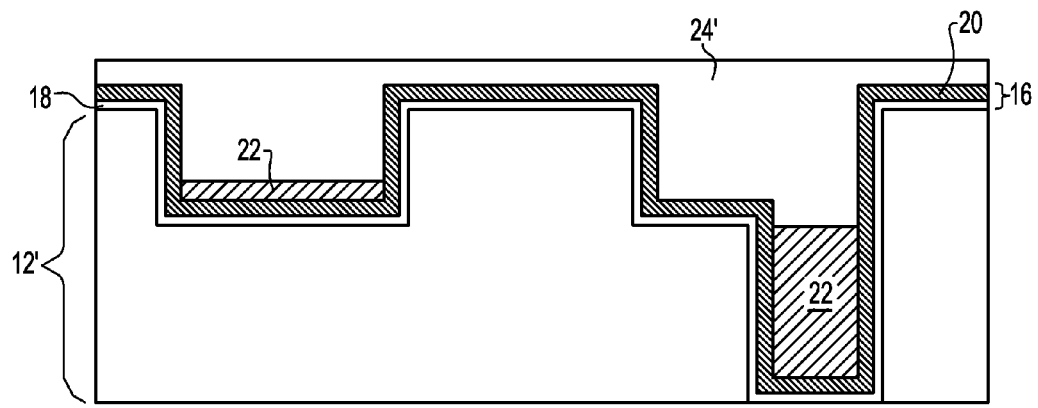
FIG. 6 is a pictorial representation (through a cross sectional view) illustrating the structure of FIG. 5 after performing copper reflow.

Referring to FIG. 6, there is illustrated the structure of FIG. 5 after performing copper reflow in which copper layer 24 containing the low impurity level is reflowed forming copper region 24'. Copper region 24' contains the same low impurity level as copper layer 24. As shown, copper region 24' containing the low impurity level which is formed by the reflow process completes fills the remaining portions of each of the at least one openings 14. In this embodiment, the copper region 24' that is formed in each of the at least one openings 14 is formed directly on an upper surface of copper region 22. As such, a bottom portion of copper region 24' forms an interface with an upper surface of copper region 22. In some embodiments, the copper region 24' containing the low impurity level is present in a line opening, while the copper region 22 containing the high impurity level is located in an underlying via opening. In some embodiments, the interface between the copper region 24' containing the low impurity level and the copper region 22 containing the high impurity level is coincident with an area that connects the line opening to the underlying via opening.

Copper reflow is a process in which copper from copper layer 24 is first melted at a temperature that causes copper to flow and then cooled to form copper region 24'. In one embodiment of the present disclosure, the copper reflow can be carried out at a temperature of 150° C. or greater. In another embodiment, the copper reflow can be carried out at a temperature from 100° C. to 500° C. In some embodiments, the copper reflow can be performed in an inert gas including, for example, helium, argon, neon, nitrogen and mixtures thereof. In other embodiments, the copper reflow can be performed in a forming gas. A forming gas is a mixture of hydrogen (mole fraction varies) and nitrogen.

The duration of the copper reflow can vary depending upon the temperature and thickness of the copper layer 24. In one embodiment, the copper reflow is performed for a duration of from 30 minutes to 5 hours. In another embodiment, copper reflow is performed for a duration of from 5 minutes to 10 hours.

Figure 7:
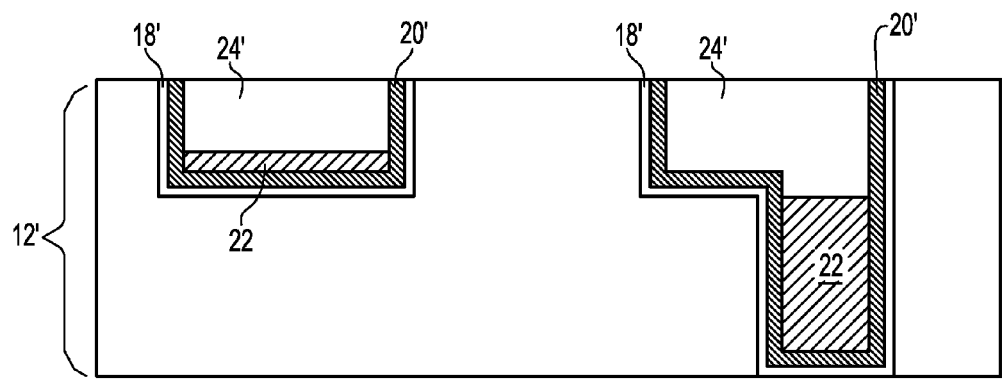
FIG. 7 is a pictorial representation (through a cross sectional view) illustrating the structure of FIG. 6 after planarization.

Referring to FIG. 7, there is illustrated the structure of FIG. 6 after planarization. The planarization process forms a structure in which an upper surface of the copper region 24' containing the low impurity level is coplanar with an upper surface of patterned dielectric material 12'. Also, the upper surface of the copper region 24' containing the low impurity level is coplanar with an upper surface of the planarized diffusion barrier layer (shown as element 18' in FIG. 7) and the upper surface of the planarized wetting layer (shown as element 20' in FIG. 7). The planarization process that can be employed in the present disclosure includes chemical mechanical planarization and/or grinding.

Figure 8:
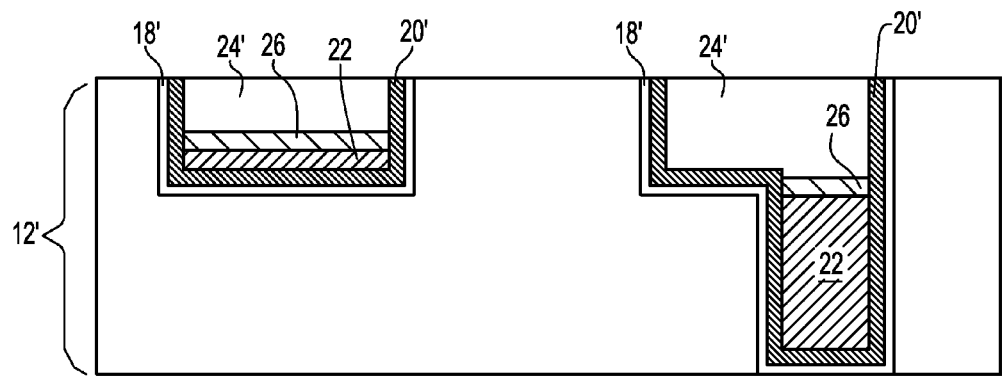
FIG. 8 is a pictorial representation (through a cross sectional view) illustrating an alternative interconnect structure that can be formed in which a liner layer is formed between a copper region having a high impurity level and a copper region having a low impurity level.

Reference is now made FIG. 8, which represents an alternative hybrid interconnect structure that can be formed in which a liner layer 26 is formed between the copper region 22 containing the high impurity level and the copper region 24' containing the low impurity level. In one embodiment and as shown in the drawing, the liner layer 26 is a continuous layer that extends from one sidewall of the at least one opening 14 to another sidewall of the at least one opening 14. In another embodiment, the liner layer 26 is a discontinuous layer.

When present, the liner layer 26 is formed atop the copper region 22 containing a high impurity level shown in FIG. 4. The processes as described above in regard to FIGS. 5-7 are then performed with the liner layer 26 present therein. In one embodiment of the present disclosure, the liner layer 26 may comprise one of the metal nitrides mentioned above for diffusion barrier layer 18. In another embodiment, the liner layer 26 may comprise, from top to bottom, a metal nitride, and one of the elemental metals mentioned above for wetting layer 20.

The liner layer 26 can be formed utilizing any conventional deposition process including those mentioned above for diffusion barrier layer 18 and wetting layer 20. The liner layer 26 that can be formed typically has a thickness from 1 nm to 20 nm, with a thickness from 2 nm to 5 nm being more typical.

Figure 9:
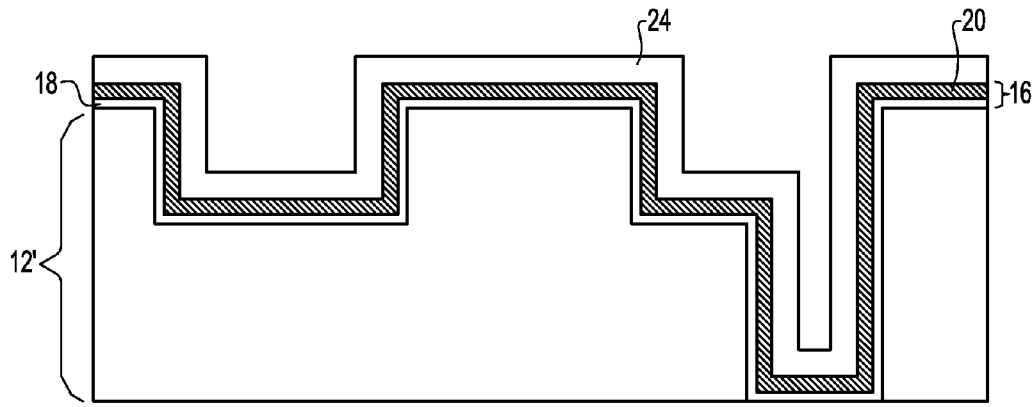
FIG. 9 is a pictorial representation (through a cross sectional view) illustrating the structure of FIG. 3 after forming a copper layer having a low impurity level within the openings.
Figure 10:
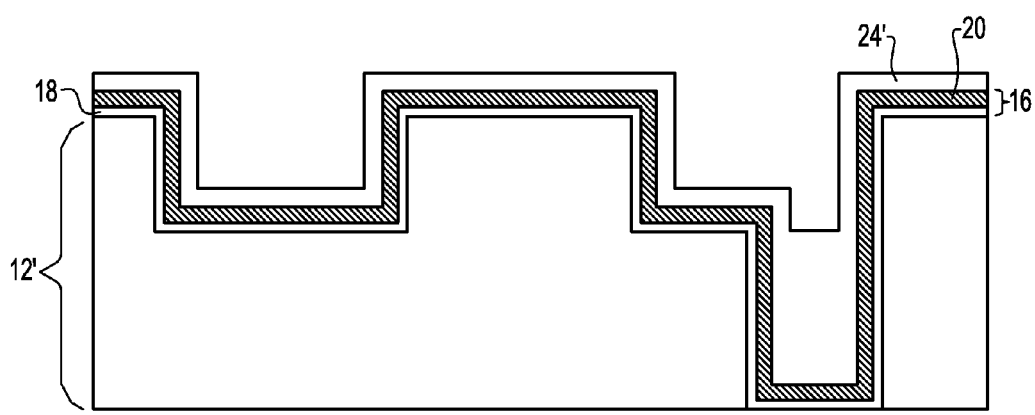
FIG. 10 is a pictorial representation (through a cross sectional view) illustrating the structure of FIG. 9 after performing copper reflow.
Figure 11:
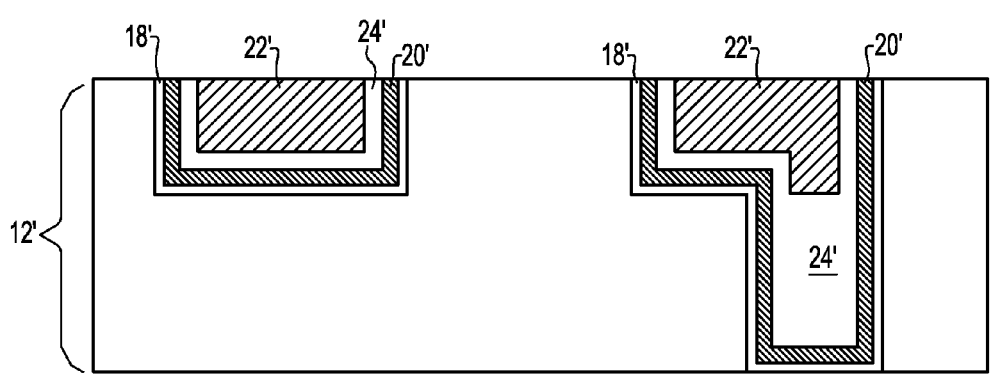
FIG. 11 is a pictorial representation (through a cross sectional view) illustrating the structure of FIG. 10 after forming a Cu layer having a high impurity level within the remaining portions of the openings and planarization.

Reference is now made to FIGS. 9-11 which illustrate another exemplary hybrid interconnect structure that can be produced in the present disclosure. In this embodiment, the copper layer 24 containing the low impurity level is first formed, then reflow into copper region 24' containing the low impurity level and thereafter the copper region 22 containing the high impurity level is formed within each of the at least one openings 14. As such, this embodiment forms an interconnect structure in which the copper region 24' of low impurity level is formed in a bottom portion of each of the at least one openings 14, and the copper region 22 of high impurity level is formed in an upper region of each of the at least one openings 14.

This embodiment of the present disclosure begins by first providing the structure shown in FIG. 3. After providing the structure shown in FIG. 3, a copper layer 24 containing a low impurity level is formed within each of the at least one openings 14. The copper layer 24 that is employed in this embodiment of the present disclosure is the same as the copper layer 24 formed in the previous embodiment of the present disclosure which is discussed above in connection with the structure illustrated in FIG. 5.

Referring to FIG. 10, there is illustrated the structure of FIG. 9 after performing copper reflow. The copper reflow process which forms copper region 24' containing the low impurity level is the same as that mentioned above in connection with providing the structure shown in FIG. 6.

In some embodiments (not shown), an optional liner layer can be formed atop the copper region 24' prior to forming the copper region 22 containing the high impurity level. The optional liner layer that can be formed is the same as that described above for liner layer 26 illustrated in FIG. 8 of the present application.

Referring now to FIG. 11, there is illustrated the structure of FIG. 10 after forming a copper region 22 containing a low impurity level within the remaining portions of the openings and planarization. The copper region 22 containing the low impurity level is the same as the copper region 22 described above in connection with providing the structure shown in FIG. 4. The planarization process employed in this embodiment of the present disclosure includes one of the planarization process mentioned above for providing the structure shown in FIG. 7 of the present application.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. An interconnect structure comprising:
   a patterned dielectric material having at least one opening located therein;
   a dual material liner located at least on sidewalls of the patterned dielectric material within the at least one opening;
   a first copper region containing a first impurity level located within a bottom region of said at least one opening; and
   a second copper region containing a second impurity level located within a top region of said at least one opening and atop the first copper region, wherein said first impurity level of said first copper region is less than the second impurity level of said second copper region.

2. The interconnect structure of claim 1, wherein said second impurity level of the second copper region has an amount of impurities of 100 ppm or greater, and the first impurity level of said first copper region has an amount of impurities of less than 20 ppm.

3. The interconnect structure of claim 2, wherein said impurities within said second impurity level of said second region of copper comprises at least one of carbon, chloride, oxygen and sulfur.

4. The interconnect structure of claim 2, wherein said impurities within the second impurity level of second copper region comprises from 150 ppm to 400 ppm carbon, from 150 ppm to 400 ppm chloride, from 150 ppm to 400 ppm oxygen, and from 150 ppm to 400 ppm sulfur.

5. The interconnect structure of claim 2, wherein said first level of impurity of said first copper region includes at least one of carbon and oxygen.

6. The interconnect structure of claim 1, wherein said first copper region is present in a via opening, and second copper region is present in an overlying line opening.

7. The interconnect structure of claim 1, further comprising a liner layer separating the first copper region from the second copper region.

8. An interconnect structure comprising:
   a patterned dielectric material having at least one opening located therein;
   a first copper region containing a first impurity level located within a bottom region of said at least one opening; and
   a second copper region containing a second impurity level located within a top region of said at least one opening and atop the first copper region, wherein said first impurity level of said first copper region is less than the second impurity level of said second copper region.

9. The interconnect structure of claim 8, wherein said second impurity level of the second copper region has an amount of impurities of 100 ppm or greater, and the first impurity level of said first copper region has an amount of impurities of less than 20 ppm.

10. The interconnect structure of claim 9, wherein said impurities within said second impurity level of said second region of copper comprises at least one of carbon, chloride, oxygen and sulfur.

11. The interconnect structure of claim 9, wherein said impurities within the second impurity level of second copper region comprises from 150 ppm to 400 ppm carbon, from 150 ppm to 400 ppm chloride, from 150 ppm to 400 ppm oxygen, and from 150 ppm to 400 ppm sulfur.

12. The interconnect structure of claim 9, wherein said first level of impurity of said first copper region includes at least one of carbon and oxygen.

13. The interconnect structure of claim 8, wherein said first copper region is present in a via opening, and second copper region is present in an overlying line opening.

14. The interconnect structure of claim 8, further comprising a liner layer separating the first copper region from the second copper region.

15. A method of fabricating an interconnect structure comprising:
   forming a patterned dielectric material having at least one opening located therein;
   forming a dual material liner at least on sidewalls of the patterned dielectric material within the at least one opening;
   providing a first copper region containing a first impurity level within a bottom region of said at least one opening; and
   providing a second copper region containing a second impurity level within a top region of said at least one opening and atop the first copper region, wherein said first impurity level of the first copper region is different from the second impurity level of the second copper region.

16. The method of claim 15, wherein said first impurity level of said first copper region is greater than the second impurity level of said second copper region, and wherein said first copper region is formed by electroplating copper, and said second copper region is formed by physical vapor deposition and copper reflow.

17. The method of claim 15, wherein said copper reflow is performed at a temperature of 150° C. or greater in an inert ambient or in a forming gas.

18. The method of claim 15, wherein said first impurity level of said first copper region is less than the second impurity level of said second copper region, and wherein said first copper region is formed by physical vapor deposition and copper reflow, and said second copper region is formed by electroplating copper.

19. The method of claim 18, wherein said copper reflow is performed at a temperature of 150° C. or greater in an inert ambient or in a forming gas.

20. The method of claim 15, further comprising forming a barrier liner between the first copper region and the second copper region.

\* \* \* \* \*